United States Patent
Han et al.

(10) Patent No.: US 10,048,601 B2
(45) Date of Patent: Aug. 14, 2018

(54) APPARATUS FOR MEASURING MASK ERROR AND METHOD THEREFOR

(71) Applicant: Samsung Electronics Co., Ltd., Suwon-si, Gyeonggi-do (KR)

(72) Inventors: Hak-Seung Han, Hwaseong-si (KR); Dong-Gun Lee, Hwaseong-si (KR); Dong-Hoon Chung, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 111 days.

(21) Appl. No.: 15/160,540

(22) Filed: May 20, 2016

(65) Prior Publication Data

US 2017/0061596 A1  Mar. 2, 2017

(30) Foreign Application Priority Data

Aug. 26, 2015  (KR) ........................ 10-2015-0120195

(51) Int. Cl.
*G06K 9/32* (2006.01)
*G03F 7/20* (2006.01)
*G03F 1/84* (2012.01)

(52) U.S. Cl.
CPC ............ *G03F 7/70783* (2013.01); *G03F 1/84* (2013.01)

(58) Field of Classification Search
CPC .. G03F 1/42; G03F 9/00–9/7096; G03F 1/84; G03F 7/70633; H01L 21/682; G06T 2207/30148; G06T 7/001; G01N 2021/95676
See application file for complete search history.

(56) References Cited

U.S. PATENT DOCUMENTS

| | | | |
|---|---|---|---|
| 5,978,094 A | 11/1999 | Narabe et al. | |
| 6,068,952 A | 5/2000 | Narimatsu et al. | |
| 6,323,560 B1 | 11/2001 | Narimatsu et al. | |
| 6,483,571 B1 * | 11/2002 | Shiraishi | G03F 9/7015 355/53 |
| 2014/0086475 A1 | 3/2014 | Daneshpanah et al. | |

(Continued)

FOREIGN PATENT DOCUMENTS

| | | |
|---|---|---|
| JP | 2004-241596 A | 8/2004 |
| JP | 2014-164036 A | 9/2014 |
| JP | 5703910 B2 | 4/2015 |

(Continued)

*Primary Examiner* — Brian Werner
(74) *Attorney, Agent, or Firm* — Harness, Dickey & Pierce, P.L.C.

(57) ABSTRACT

An apparatus for measuring a mask error and a method for measuring a mask error are provided. The apparatus for measuring a mask error includes a stage configured to accommodate a reference mask having a reference pattern, and a target mask adjacent to the reference mask such that a mask pattern of the target mask faces the reference pattern, a light source configured to irradiate the first beam onto the reference mask and the target mask, a light receiving unit including an image sensor, and the image sensor configured to receive a composite image including a first image generated from the reference pattern and a second image generated from the mask pattern, and generate a third image from the first image and the second image, and a measuring unit configured to measure an error of the mask pattern from the third image.

19 Claims, 18 Drawing Sheets

(56) References Cited

U.S. PATENT DOCUMENTS

2015/0009488 A1* 1/2015 Okamoto ............ G03F 7/70783
356/72

FOREIGN PATENT DOCUMENTS

| KR | 10-0271125 B1 | 12/2000 |
| KR | 10-0310423 B1 | 9/2001 |
| KR | 10-0446653 B1 | 9/2004 |
| KR | 2010-0011224 A | 2/2010 |

* cited by examiner

1200

1300

1400

APPARATUS FOR MEASURING MASK ERROR AND METHOD THEREFOR

CROSS-REFERENCE TO RELATED APPLICATION

This application claims priority under 35 U.S.C. § 119 to Korean Patent Application No. 10-2015-0120195, filed on Aug. 26, 2015 in the Korean Intellectual Property Office, and the contents of which in its entirety are herein incorporated by reference.

BACKGROUND

1. Field

The inventive concept inventive concepts relate to apparatuses for measuring a mask error and/or methods for measuring a mask error.

2. Description of the Related Art

In general, a circuit pattern is formed on a wafer through a photolithography process. When the photolithography process is performed, the wafer is exposed to light through a mask having a pattern formed thereon.

As a semiconductor device is becoming highly integrated, mask pattern pitches are becoming finer and finer. In particular, in performing accurate exposure using the mask pattern, improved precision is desired when determining whether the mask pattern is aligned with respect to a proper position.

As the mask pattern is formed in a finer pitch, there is an increasing demand for an apparatus for measuring a mask error with improved precision.

SUMMARY

The inventive concepts provide apparatuses for accurately measuring an error of a target mask to be measured using a single image sensor and a reference mask.

The inventive concepts also provide methods for accurately measuring an error of a target mask to be measured using a single image sensor and a reference mask.

These and other objects of the inventive concepts will be described in or be apparent from the following description of the example embodiments.

According to an aspect of the inventive concepts, an apparatus for measuring a mask error includes a stage configured to accommodate a reference mask having a reference pattern, and a target mask adjacent to the reference mask such that a mask pattern of the target mask faces the reference pattern, a light source configured to irradiate the first beam onto the reference mask and the target mask, a light receiving unit including an image sensor, and the image sensor configured to receive a composite image including a first image generated from the reference pattern and a second image generated from the mask pattern, and generate a third image from the first image and the second image, and a measuring unit configured to measure an error of the mask pattern from the third image.

According to another aspect of the inventive concepts, an apparatus for measuring a mask error includes a reference mask, which includes a reference pattern, therein, and a target mask, which includes a mask pattern, on the reference mask such that the mask pattern faces the reference pattern in an aligned manner, a light source configured to irradiate a first beam onto the reference mask and the target mask, a beam splitter configured to receive the first beam and split the first beam into a second beam and a third beam, the second beam being a portion of the first beam reflected by the reference mask, the third beam being a portion of the first beam reflected by the target mask, and an image sensor configured to receive the second beam and the third beam According to still another aspect of the inventive concepts, an apparatus for measuring a mask error includes a stage configured to accommodate a reference mask having a reference pattern, and a target mask having a mask pattern, a light source irradiating a first beam onto the reference mask and the target mask, a light receiving unit including an image sensor, and the image sensor configured to receive a second beam, which is generated by the first beam reflected by the reference pattern and the mask pattern, the second beam including a first image generated from the reference pattern and a second image generated from the mask pattern, and generate a third image from the first image and the second image, and a processor configured to measure an error of the mask pattern from the third image based on a relative position of the mask pattern with respect to the reference pattern.

BRIEF DESCRIPTION OF THE DRAWINGS

The above and other features and advantages of the inventive concepts will become more apparent by describing in detail some example embodiments thereof with reference to the attached drawings in which.

DETAILED DESCRIPTION

Figure 1:
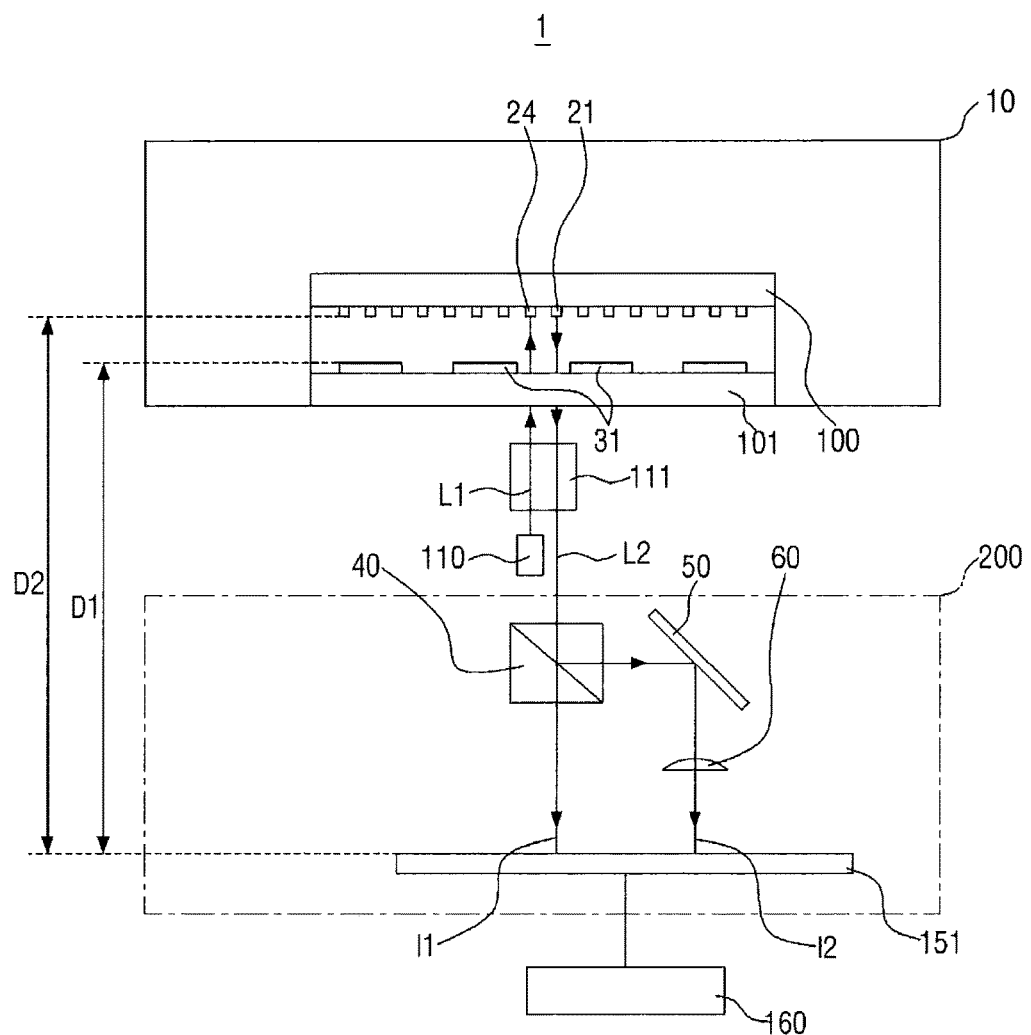
FIG. 1 is a diagram of a mask error measurement system according to an example embodiment of the inventive concepts.

Advantages and features of the inventive concepts and/or methods of accomplishing the same may be understood more readily by reference to the following detailed description of some example embodiments and the accompanying drawings. The inventive concepts may, however, be embodied in many different forms and should not be construed as being limited to the example embodiments set forth herein. Rather, these example embodiments are provided so that this disclosure will be thorough and complete and will fully convey the concepts of the inventive concepts to those skilled in the art, and the inventive concepts will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concepts.

The inventive concepts will be described with reference to perspective views, cross-sectional views, and/or plan views, in which some example embodiments of the inventive concepts are shown. Thus, the profile of an example view may be modified according to manufacturing techniques and/or allowances. That is, the example embodiments of the inventive concepts are not intended to limit the scope of the inventive concepts but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this inventive concepts belong. It is noted that the use of any and all examples, or example terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Hereinafter, a mask error measurement system according to some embodiment of the inventive concepts will be described with reference to the accompanying drawings.

FIG. 1 is a diagram of a mask error measurement system according to an example embodiment of the inventive concepts.

Referring to FIG. 1, the mask error measurement system 1 includes a stage 10, a target mask 100, a reference mask 101, a light source 110, an objective lens 111, a receiving unit 200, and a measuring unit 160.

The stage 10 may support the target mask 100 to be measured and the reference mask 101.

The target mask 100 may be disposed on the stage 10 and may include mask patterns 21 and 24 on its plane. The mask patterns 21 and 24 formed on one surface of the target mask 100 are transferred to a photo resist coated on a surface of a semiconductor substrate during an exposure process to then be used in forming circuit patterns in subsequent processes.

The reference mask 101 may be disposed adjacent to the target mask 100 and include a reference pattern 31 formed on one surface of the reference mask 101. In some example embodiments of the inventive concepts, the reference mask 101 and the target mask 100 may be disposed to vertically overlap each other. Further, the reference mask 101 may be disposed a first distance D1 away from the image sensor 151, and the target mask 100, which is disposed on the reference mask 101, may be disposed a second distance D2 away from the image sensor 151. Therefore, a difference between the distances of the reference mask 101 and the target mask 100 with respect to the image sensor 151 may be equal to a distance difference (D2−D1) between the second distance D2 and the first distance D1.

When the reference mask 101 and the target mask 100 are disposed to vertically overlap each other, the mask patterns 21 and 24 may be positioned in a region where the reference pattern 31 is formed. A method for measuring a mask error using the reference pattern 31 and the mask patterns 21 and 24 will later be described in detail.

The light source 110 may irradiate a first beam L1 into the reference mask 101 and the target mask 100. The light source 110 may include various kinds of light sources for generating beams, for example, a lamp. In some example embodiments of the inventive concepts, the light source 110 may include, for example, a helium neon (HeNe) laser, an argon (Ar) laser, or a laser diode (LD) emitting light of various wavelengths, hut not limited thereto.

The first beam L1 emitted from the light source 110 may be irradiated onto the reference mask 101 and the target mask 100 through the objective lens 111. The irradiated first beam L1 may be reflected by the reference mask 101 and the target mask 100, thereby being produced as a second beam L2.

The second beam L2 reflected by the reference mask 101 and the target mask 100 may include a first image I1 and a second image I2. Here, the first image I1 may include an image generated from the reference pattern 31 of the reference mask 101, and the second image I2 may include an image generated from the mask patterns 21 and 24 of the target mask 100, but aspects of the inventive concepts are not limited thereto. According to some example embodiments, the image generated from the reference pattern 31 of the reference mask 101 may be included in the second image I2, and the image generated from the mask patterns 21 and 24 of the target mask 100 may be included in the first image I1.

The light receiving unit 200 may include a beam splitter 40, a mirror 50, a compensating lens 60 and an image sensor 151.

The beam splitter 40 may split the second beam L2 reflected from the reference mask 101 and the target mask 100 into a first image I1 and a second image I2. For example, the beam splitter 40 may transmit the first image I1 included in the second beam L2 while reflecting the second image I2 included in the second beam L2.

In some example embodiments of the inventive concepts, the beam splitter 40 may include a polarizing beam splitter. In the case that the beam splitter 40 is a polarizing beam splitter, the first image I1 split by the beam splitter 40 may include s-polarized beam and the second image I2 may include p-polarized beam.

The mirror 50 may change an optical path of the second image I2 split by the beam splitter 40. In some example embodiments of the inventive concepts, the first image I1 and the second image I2 may be formed on the same region of the image sensor 151 to form a single image. Therefore, in order to irradiate the first image I1 and the second image I2 onto the same region of the image sensor 151, the optical path of the second image I2 may be adjusted using the mirror 50.

In FIG. 1, the light receiving unit 200 including only one mirror 50 is illustrated, but aspects of the inventive concepts are not limited thereto. For example, the optical path of the second image I2 may be adjusted using the light receiving unit 200 including a plurality of mirrors 50.

The compensating lens 60 may allow the second image I2 to pass therethrough and focus the image included in the second image I2 of the target mask 100 (or of the reference mask 101).

For example, the target mask 100 and the reference mask 101 may be spaced apart from each other by the distance difference (D2–D1). Therefore, in a case where the target mask 100 and the reference mask 101 are simultaneously subjected to error measurement using a single lens system, one mask may be focused and the other may not be focused, thereby obtaining a blurry image.

For example, when the light receiving unit 200 focuses an image of the mask patterns 22 to 24 of the target mask 100 for error measurement, an image of the reference pattern 31 of the reference mask 101 may not be focused due to a distance difference between the target mask 100 and the reference mask 101 with respect to the image sensor 151.

The mask error measurement system 1 according to an example embodiment of the inventive concepts measures relative positions of the mask patterns 22 to 24 of the target mask 100 using the reference mask 101 having the reference pattern 31. Here, if one of the reference mask 101 and the target mask 100 is not focused due to the distance between the reference mask 101 and the target mask 100, which vertically overlap each other, mask error measurement accuracy may be degraded.

According to an example embodiment of the inventive concepts, the mask error measurement system 1 may focus the non-focused image by passing the non-focused image through the compensating lens 60.

Figure 2A:
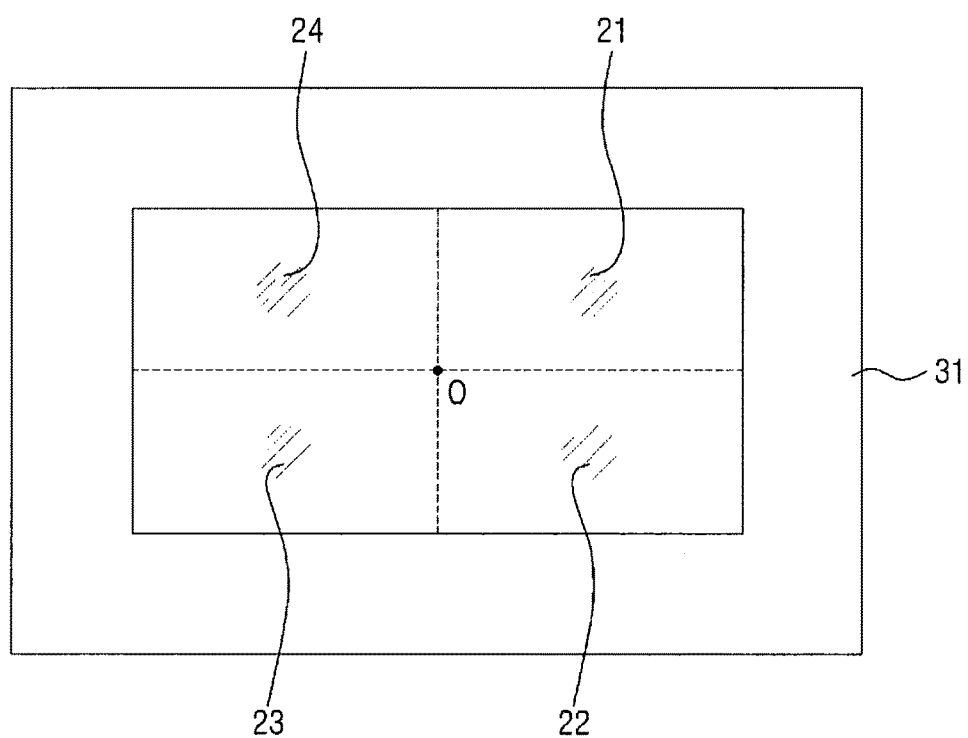
FIGS. 2A, 2B, and 2C are diagrams of images obtained by the mask error measurement system shown in FIG. 1.
Figure 2B:
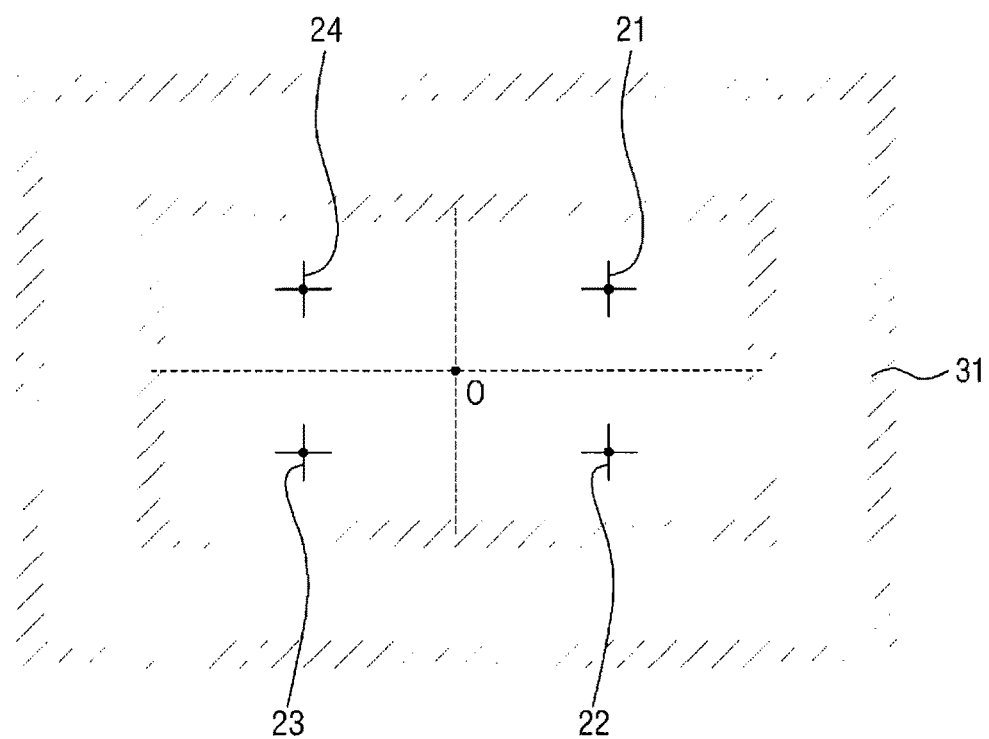

FIGS. 2A and 2B are diagrams of images obtained by the mask error measurement system shown in FIG. 1.

Referring to FIG. 2A, after being split by the beam splitter 40, the image (e.g., the first image I1) of the reference pattern 31 of the reference mask 101 may be focused, but the image (e.g., the second image I2) of the mask patterns 22 to 24 of the target mask 100), which are relatively distant from the image sensor 151, may be unfocused and blurred.

Referring to FIG. 2B, in order to obtain focused images for the mask patterns 22 to 24 of the target mask 100, the images of the mask patterns 22 to 24 of the target mask 100 may pass through the compensating lens 60.

The image of the mask patterns 22 to 24 of the target mask 100, which pass through the compensating lens 60, may undergo focus compensation taking into account the distance difference (D2–D1). As the result, the compensated and focused image e.g., the second image I2) of the mask patterns 22 to 24 of the target mask 100 may be formed at the image sensor 151. Meanwhile, the image (e.g., the first image I1) of the reference pattern 31 of the reference mask 101 may not be focused at the image sensor 151 and thus form a blurred image.

Referring again to FIG. 1, the first image I1 and the second image I2 having passed through the compensating lens 60 are supplied to the image sensor 151. The image sensor 151 may include, for example, a charge coupled device (CCD), but aspects of the inventive concepts are not limited thereto.

The measuring unit 160 may measure mask error with respect to the images obtained by the image sensor 151. The measuring unit 160 may be implemented using hardware components, software components, or a combination thereof. For example, the hardware components may include microcontrollers, memory modules, sensors, amplifiers, band-pass filters, analog to digital converters, and processing devices, or the like. A processing device may be implemented using one or more hardware device(s) configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device(s) may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such as parallel processors, multi-core processors, distributed processing, or the like. The software components may include a computer program, a piece of code, an instruction, or some combination thereof, to independently or collectively instruct and/or configure the processing device to operate as desired, thereby transforming the processing device into a special purpose processor. The software components may be embodied permanently or temporarily in any type of machine, component, physical or virtual equipment, and/or computer storage medium or device. The software components may be stored by one or more computer readable recording mediums.

Figure 2C:
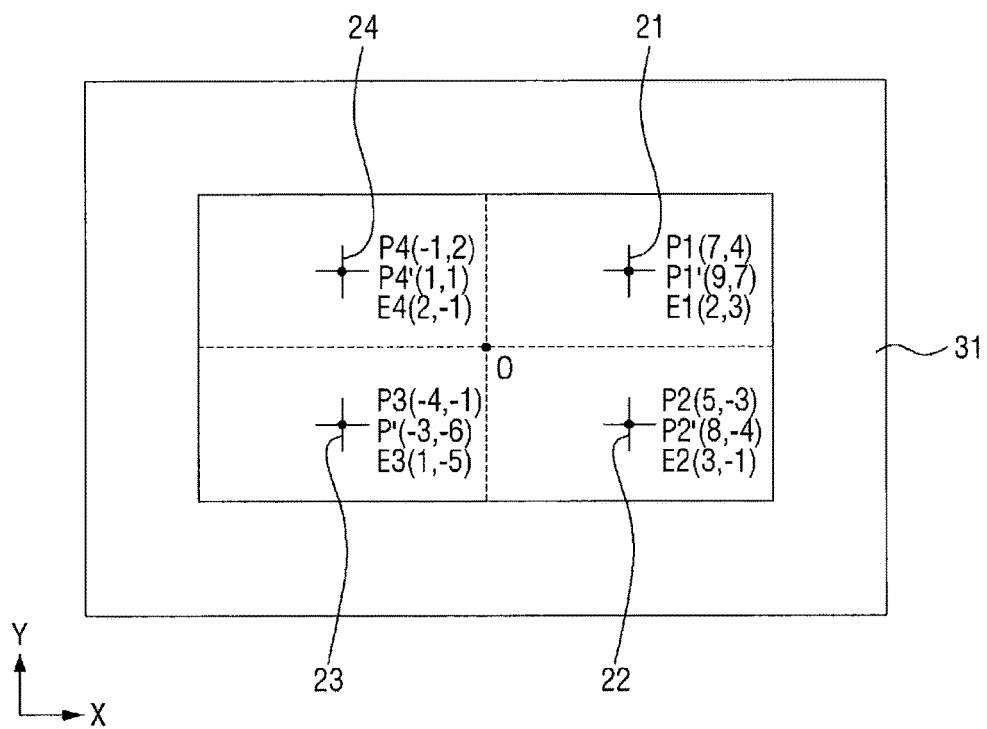

FIG. 2C illustrates images obtained by the mask error measurement system shown in FIG. 1.

Referring to FIG. 2C, with respect to center point O of the reference pattern 31, relative coordinate values of the first to fourth mask patterns 21 to 24 may be measured. For example, in the event that the first mask pattern 21, which is desired to be formed at a position P1 (7, 4) according to a circuit design, is actually formed at a position P1' (9, 7), then an error E1 (2, 3) is generated with respect to the first mask pattern 21.

The remaining second to fourth mask patterns 22 to 24, which are desired to be formed at positions P2 (5, −3), P3 (−4, −1) and P4 (−1, 2), respectively, according to the circuit design, are actually formed at positions (8, −4), P3' (−3, 6) and P4' (1, 1), respectively, then, errors E2 (3, −1), E3 (1, −5) and E4 (2, −1) are generated with respect to the second to fourth mask patterns 22 to 24, respectively.

, Therefore, in order to improve exposure accuracy in a subsequent exposure process, calculating a compensated value of the mask error may be desired. Various algorithms may be used to calculate the compensated value of the mask error. According to some example embodiments, a mean value of errors of the first to fourth mask patterns 21 to 24 may be calculated, and a value having a sign opposite to that of the mean value may be defined as the compensated value. According to this scheme, the calculated compensated value of the first to fourth mask patterns 21 to 24 as illustrated in FIG. 2C may be A (−2, 1). In a subsequent exposure process, the first to fourth mask patterns 21 to 24 may be compensated by A (−2, 1), and then may be subjected to a exposure process.

As described above, the mask error can be measured with high accuracy by measuring relative positions of the mask patterns 21 to 24 with respect to positions of the reference pattern 100 of the reference mask 101.

When mask errors are measured using the mask patterns 21 to 24 of the target mask 100, measurement results may be considerably affected by external circumferences, such as atmospheric pressure or temperature. Thus, the measurement accuracy of a mask error measurement system may have limits.

However, in the mask error measurement system according to the example embodiment of the inventive concepts, the reference mask 101 and the target mask 100 are similarly affected by external circumferences. Thus, relative positions of the image of the mask patterns 22 to 24 of the target mask 100 with respect to the image of the reference pattern 31 of the reference mask 101 may not change substantially. Further, by configuring the images of the reference mask 101 and the target mask 100 to be irradiated onto a single image sensor 151 at once, the measurement accuracy can be improved.

Figure 3A:
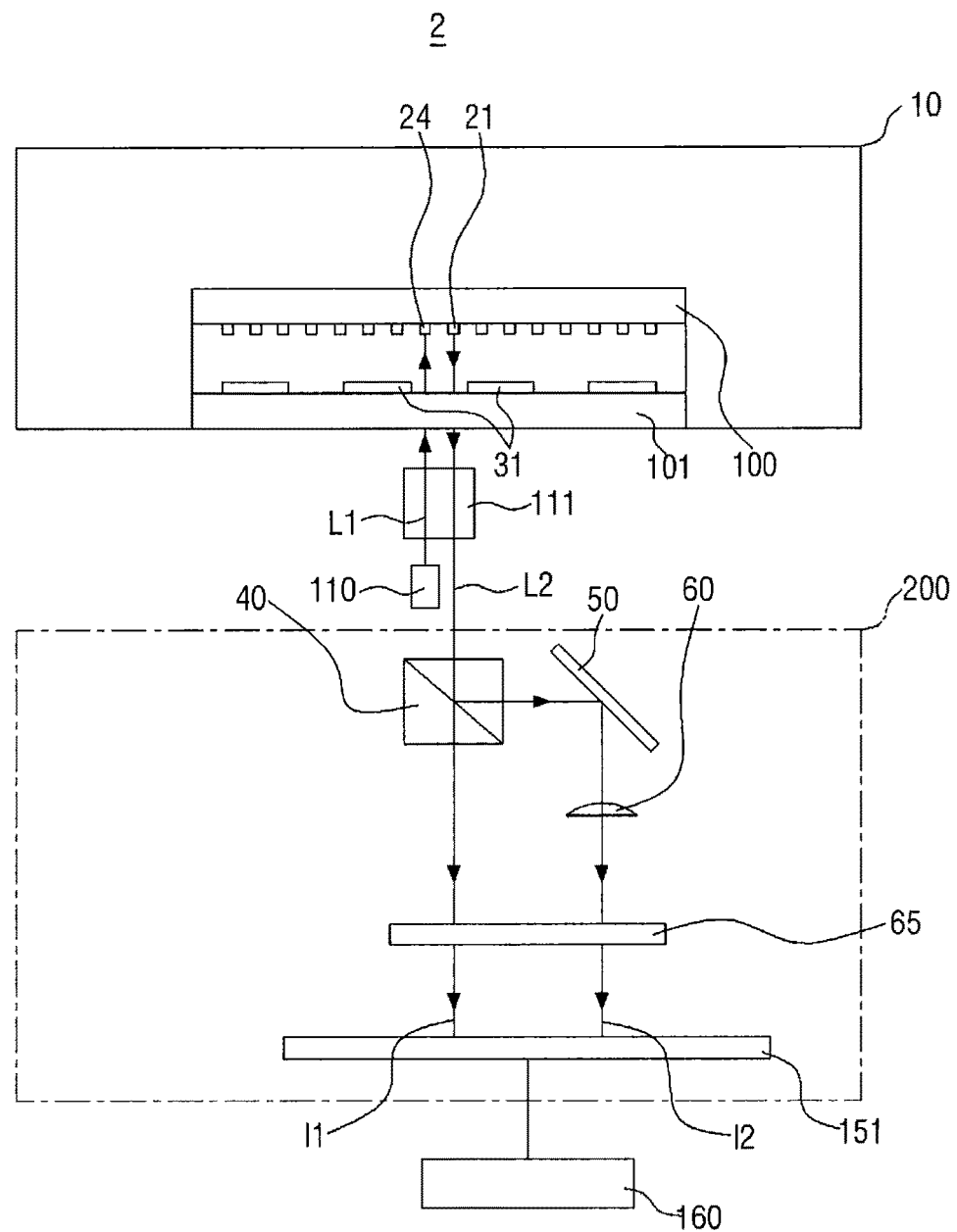
FIG. 3A is a diagram of a mask error measurement system according to another example embodiment of the inventive concepts and FIGS. 3B and 3C are diagrams illustrating an operation of the mask error measurement system shown in FIG. 3A.
Figure 3B:
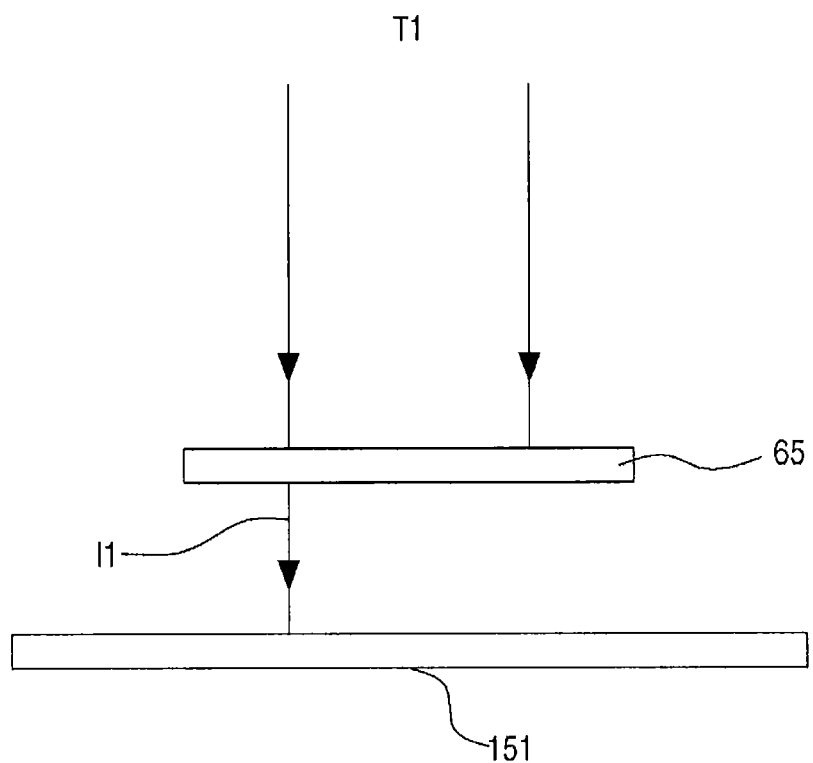
Figure 3C:
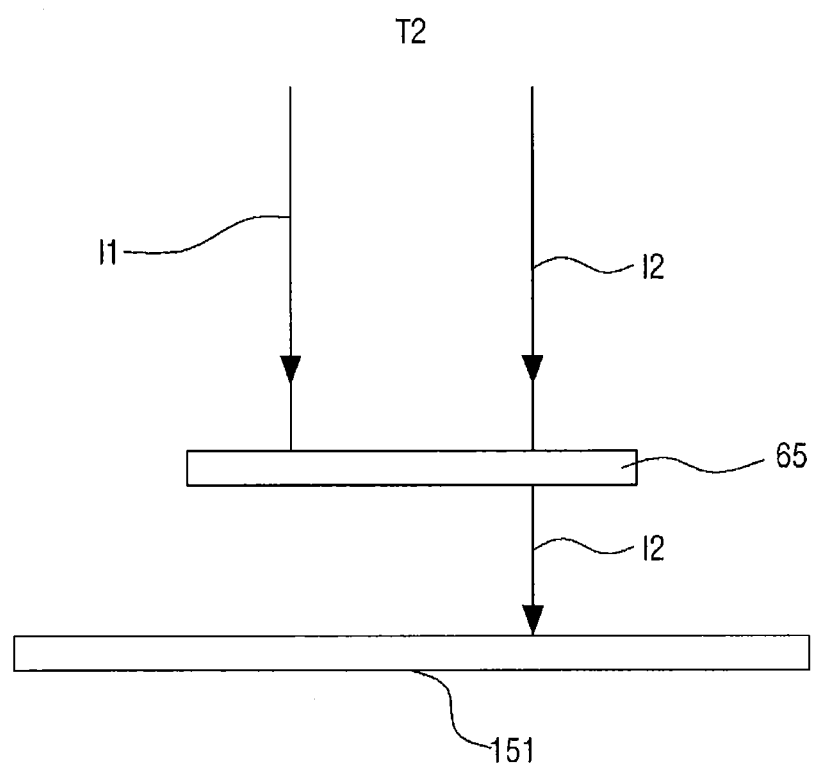

FIG. 3A is a diagram of a mask error measurement system according to another example embodiment of the inventive concepts and FIGS. 3B and 3C are diagrams illustrating an operation of the mask error measurement system shown in FIG. 3A.

Referring to FIGS. 3A to 3C, the mask error measurement system 2 may further include a shutter 65.

The shutter 65 may supply the image sensor 151 with the first and second images I1 and I2 in a sequential manner. For example, the shutter 65 may shut the second image I2 at a first time T1 while supplying the image sensor 151 with the first image I1, as illustrated in FIG. 3B.

Further, the shutter 65 may shut the first image I1 at a second time T2 while supplying the image sensor 151 with the second image as illustrated in FIG. 3C.

By sequentially supplying the first and second images I1 and I2 of the respective masks at different times, interference between the first and second images I1 and I2 may be reduced.

In a case where the beam splitter 40 is a polarizing beam splitter, the first image I1 may be, for example, s-polarized beam and the second image I2 may be, for example, p-polarized beam. The shutter 65 may sequentially shut the first and second images I1 and I2 at the first time T1 and the second time T2 while varying directions of a polarizing filter.

Figure 4:
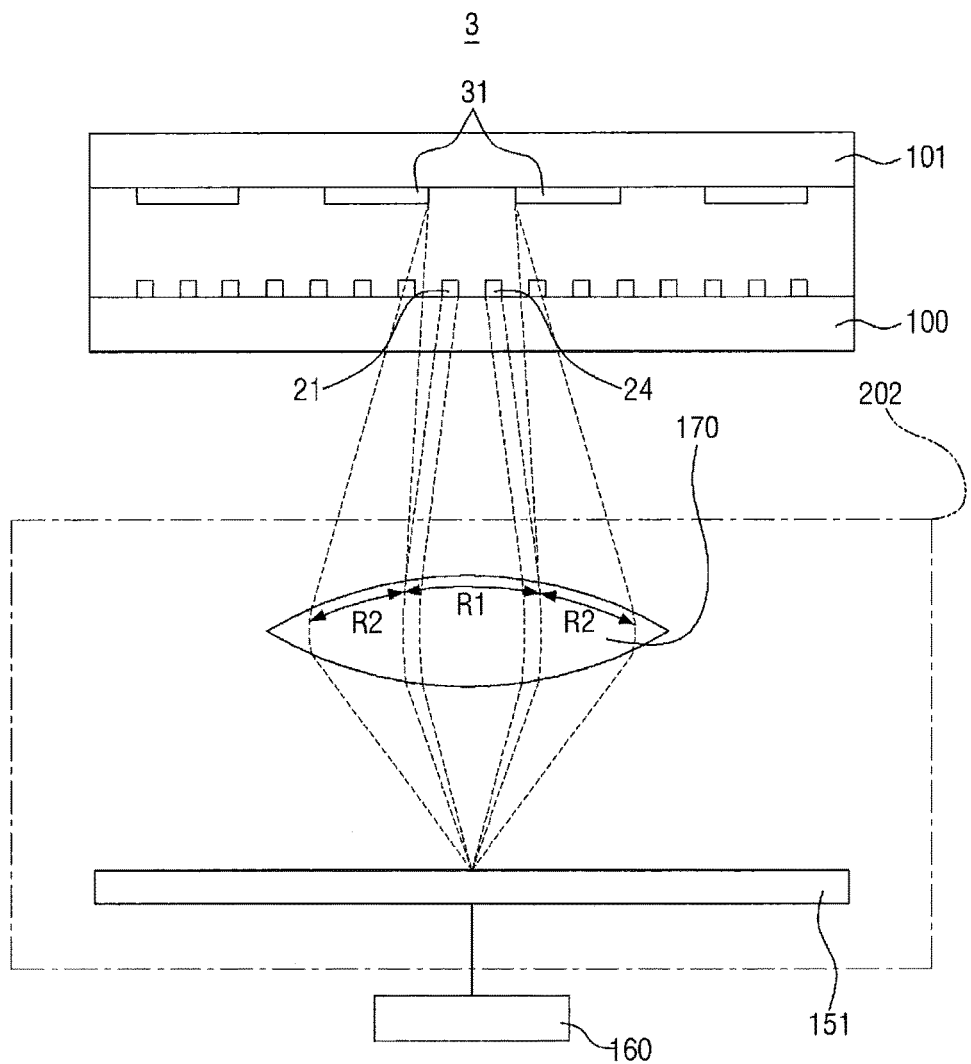
FIGS. 4, 5, 6, 7, and 8A are diagrams of mask error measurement systems according to some example embodiments of the inventive concepts.

FIG. 4 is a diagram of a mask error measurement system according to still another example embodiment of the inventive concepts. In the present example embodiment, the same content as in the previous example embodiment will not be repeatedly described and the following description will focus on differences between the mask error measurement systems according the present and previous example embodiments. In the mask error measurement system 3 shown in FIG. 4, an objective lens 111 and a light source 110 are not illustrated for simplicity.

The mask error measurement system 3 is different from the mask error measurement system 2 shown in FIG. 3A in view of a configuration of a light receiving unit 202. The light receiving unit 202 may transmit images of mask patterns 21 and 24 and an image of a reference pattern 31 using a lens 170 having different focuses at various regions thereof.

The lens 170 may be a lens having different focuses formed at a first region R1 and a second region R2. For example, in order to clearly focus the images of the reference mask 101 and the target mask 100 even with different distances from the image sensor 151, the first region R1 for transmitting the images of the mask patterns 21 and 24 and the second region R2 for transmitting the image of the reference pattern 31 may have different focuses. Therefore, provision of one or more separate compensating lenses with respect to masks having different distances from an image sensor may not be provided.

Figure 5:
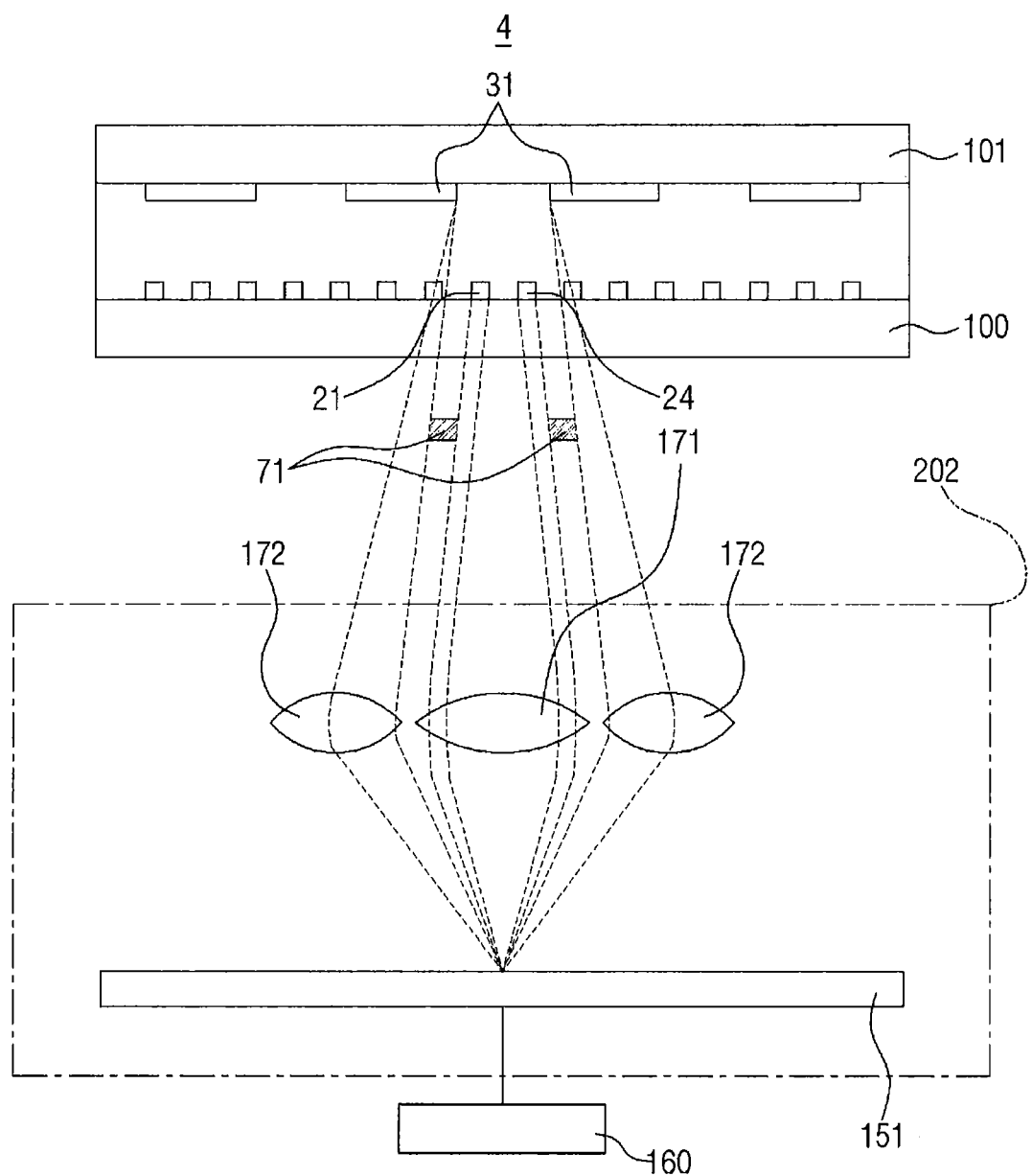

FIG. 5 is a diagram of a mask error measurement system according to still of other example embodiment of the inventive concepts.

A light receiving unit 202 of the mask error measurement system 4 may include a first lens 171 and a second lens 172 having different focal distances and spaced apart from each other. Instead of using the mask error measurement system 3 including the single lens 170 as illustrated in FIG. 4, the mask error measurement system 4 may include a plurality of lenses 171 and 172 having different focal distances.

In the example embodiment illustrated in FIG. 5, the first lens 171 may transmit images of mask patterns 21 and 24 and the second lens 172 may transmit an image of a reference pattern 31. In order to mitigate or avoid image interference between the first and second lenses 171 and 172, a shielding layer 71 may be disposed between a target mask 100 and each of the first and second lenses 171 and 172. The shielding layers 71 may optically separate the images of the mask patterns 21 and 24 from the image of the reference pattern 31.

Figure 6:
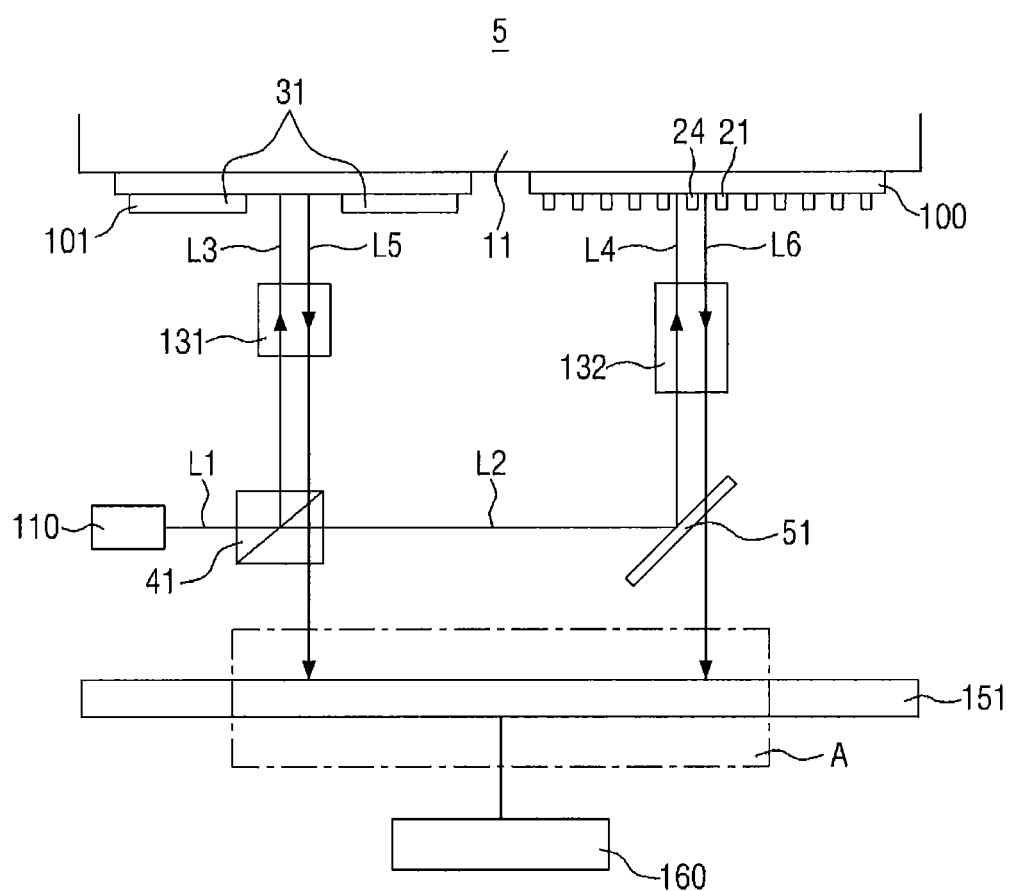

FIG. 6 is a diagram of a mask error measurement system according to still another example embodiment of the inventive concepts.

Unlike the mask error measurement systems 1 to 4 according to the previous example embodiments, the mask error measurement system 5 may be configured to arrange a target mask 100 and a reference mask 101 on a same plane of a stage 11 and to be parallel with each other.

In order to irradiate a first beam L1 generated from a light source 110 into the target mask 100 and the reference mask 101, a beam splitter 41 may be provided. The beam splitter 41 may reflect a portion of the first beam L1 to irradiate a third beam L3 into the reference mask 101 through a first objective lens 131 and may transmit the remaining portion of the first beam L1 to generate a second beam L2. The second beam L2 may be reflected by a mirror 51 to then be irradiated onto the target mask 100 through a second objective lens 132 as a fourth beam L4.

While the target mask 100 and the reference mask 101 are disposed on a same plane of the stage 11 to be parallel with each other, the images of the target mask 100 and the image of the reference mask 101 may be irradiated onto the same region A of the image sensor 151. Therefore, error measurement of the target mask 100 may be performed in the same manner as in the previous example embodiments.

Figure 7:
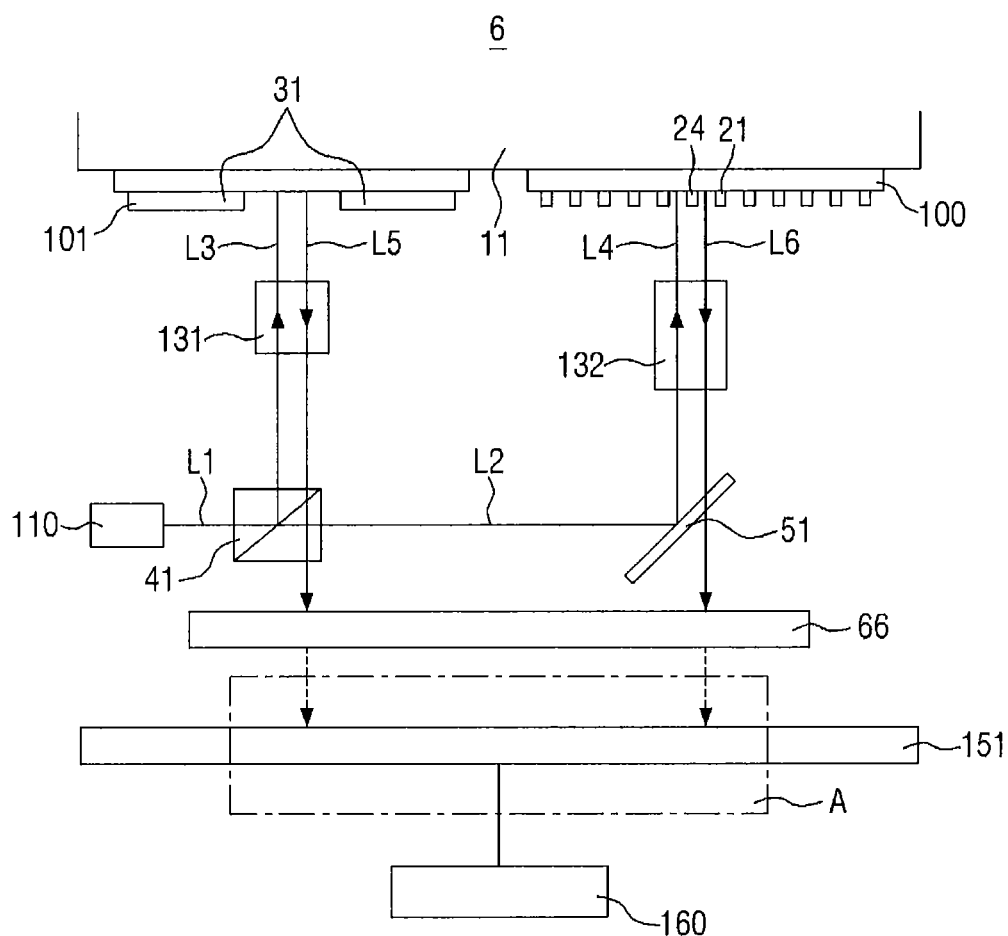

Referring to FIG. 7, a mask error measurement system 6 may be configured such that fifth and sixth beams L5 and L6 reflected from the reference mask 101 and the target mask 100 may pass through a shutter 66 and then be irradiated onto an image sensor 151. As stated in the previous example embodiment, the shutter 66 may be configured to supply the image sensor 151 with the fifth and sixth beams L5 and L6 in a sequential manner.

Figure 8A:
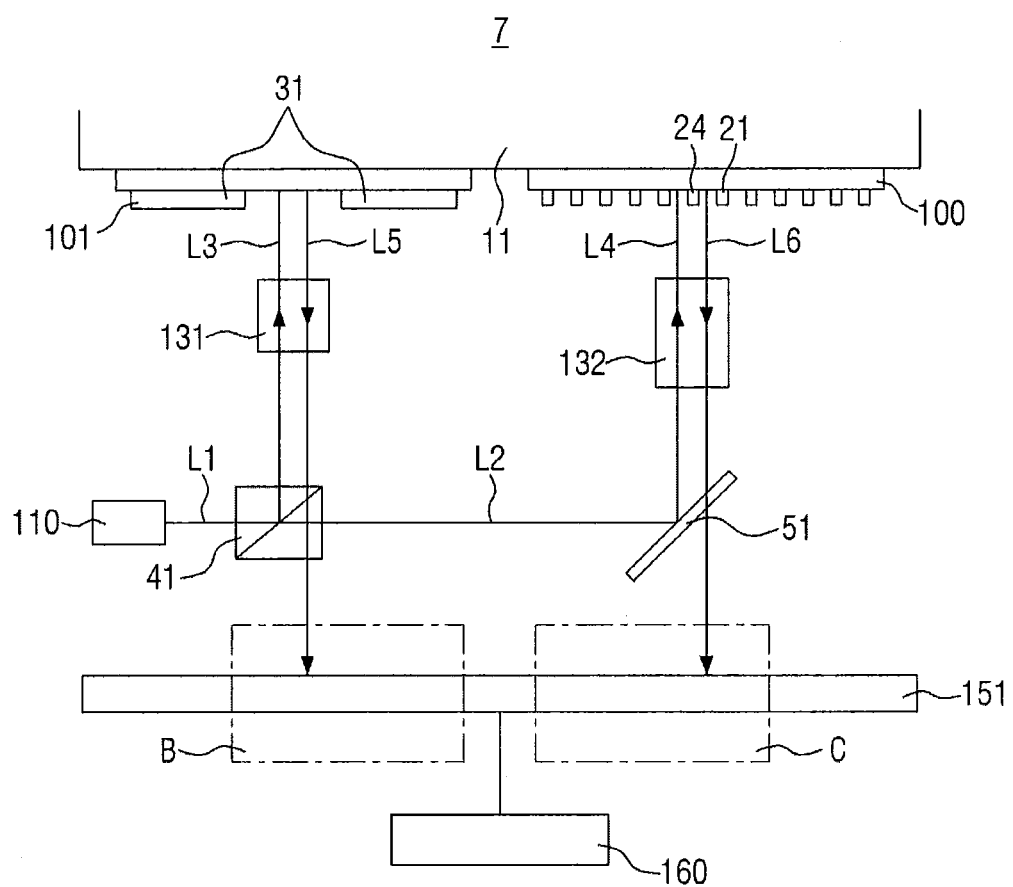
Figure 8B:
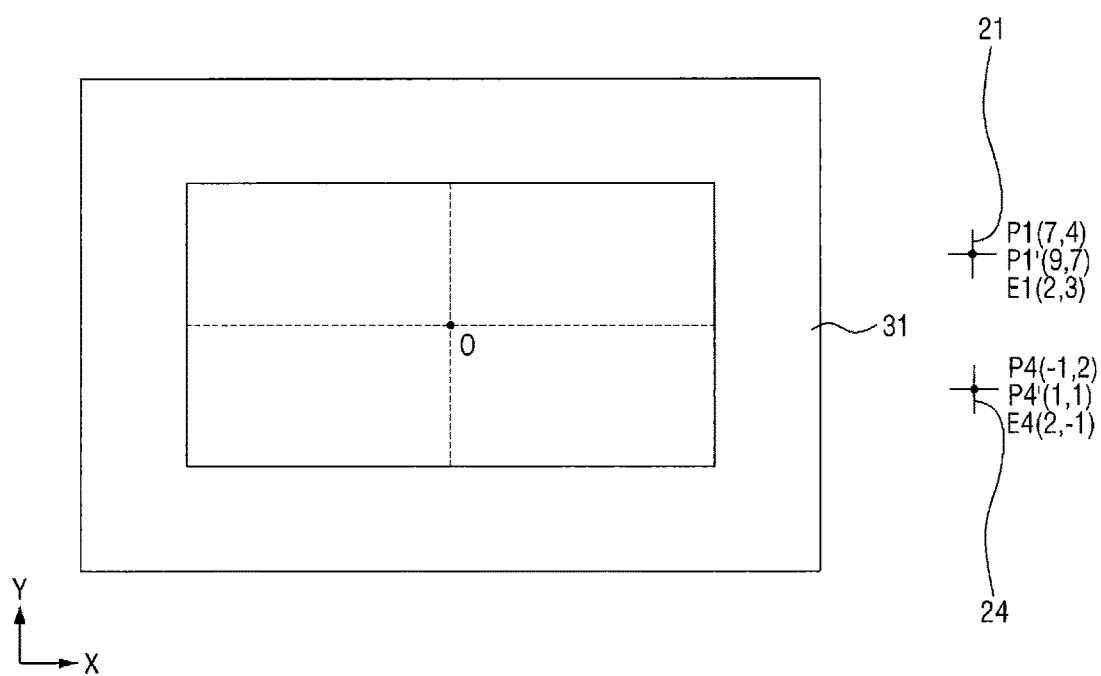
FIG. 8B is a diagram of an image obtained by the mask error measurement system shown in FIG. 8A.

Referring to FIGS. 8A and 8B, the present example embodiment may be different from the previous example embodiments in view of regions of an image sensor into which images of a target mask 100 and a reference mask 101 are irradiated.

For example, in the previous example embodiments, the images of the target mask 100 and the reference mask 101 may be configured to be formed on the same region of the image sensor 151 (see FIG. 3C). In the present example embodiment, the images of a reference mask 31 and mask patterns 21 and 24 may be formed on different regions B and C of the image sensor 151, respectively.

Even when the images of the reference mask 31 and the mask patterns 21 and 24 are formed on the different regions B and C, relative positions of the mask patterns 21 and 24 with respect to the center point O of the reference mask 31 may be calculated. Therefore, mask errors and a compensated value can be calculated in substantially the same manner as in the previous example embodiments.

Figure 9:
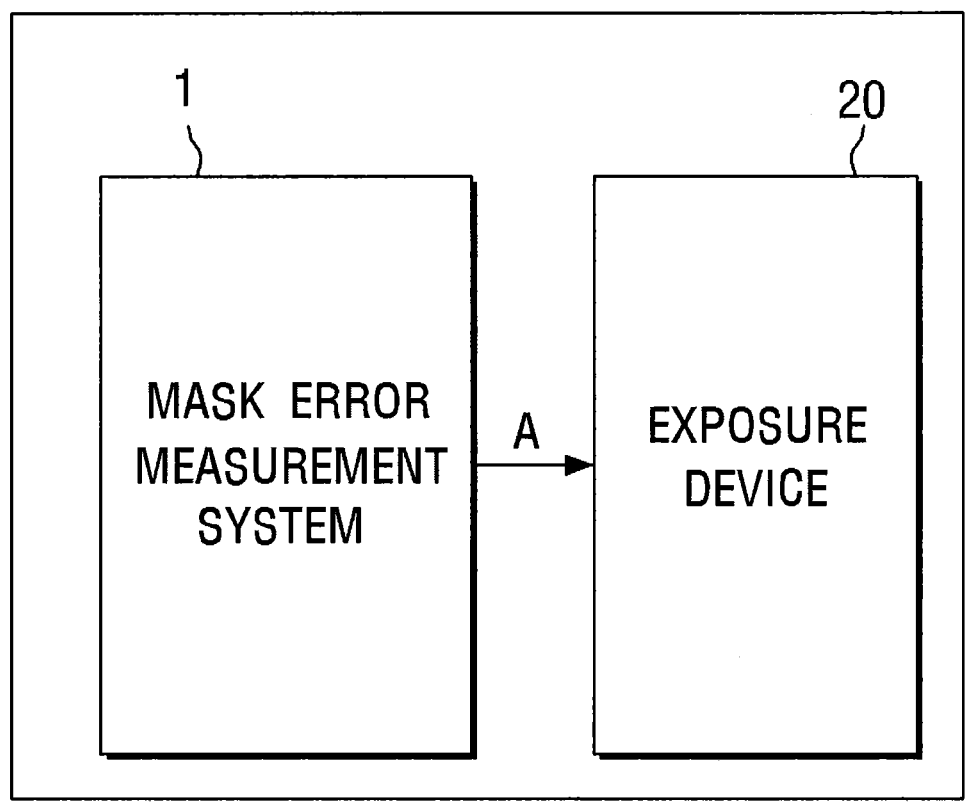
FIG. 9 is a block diagram of an exposure system including a mask error measurement system according to an example embodiment of the inventive concepts.

FIG. 9 is a block diagram of an exposure system including a mask error measurement system according to an example embodiment of the inventive concepts The exposure system 10 may include a mask error measurement system 1 and an exposure device 20.

A compensated value (e.g., A (−2, 1) of FIG. 3C) can be obtained using the mask error measurement systems according to the example embodiments of the inventive concepts. The compensated value may be supplied to the exposure device 20, and the exposure device 20 may improve exposure accuracy using the compensated mask pattern.

Figure 10:
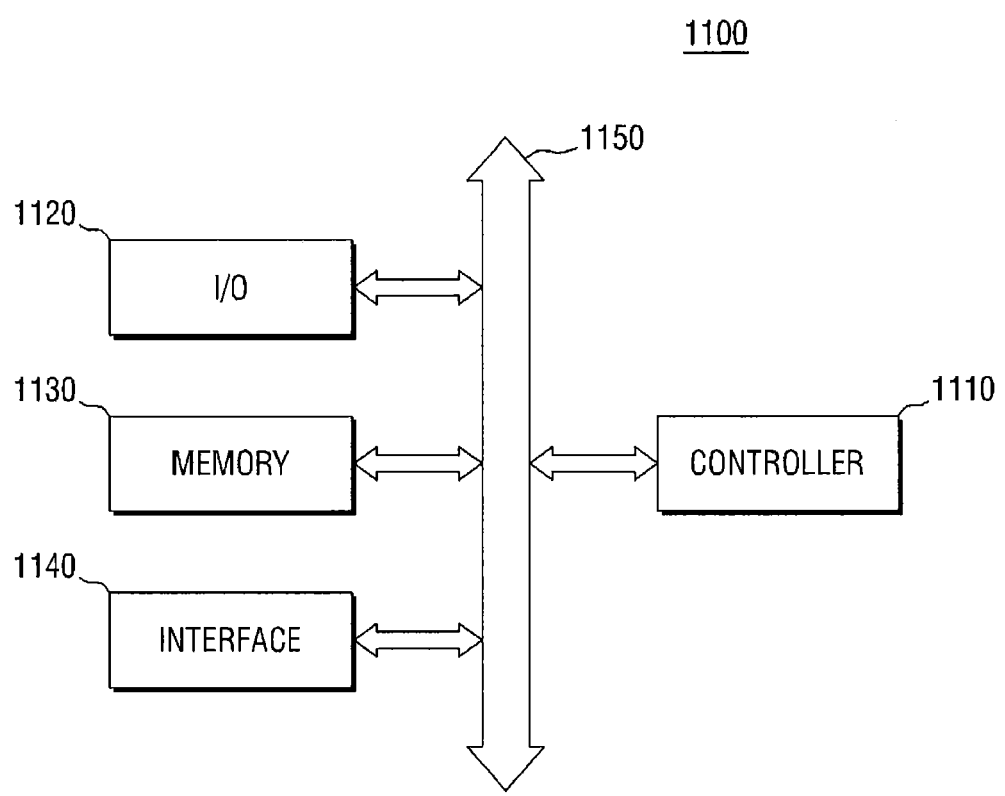
FIG. 10 is a block diagram of an electronic system including semiconductor devices manufactured using the mask error measurement systems according to some example embodiments of the inventive concepts.

FIG. 10 is a block diagram of an electronic system including semiconductor devices manufactured using the mask error measurement systems according to some example embodiments of the inventive concepts.

Referring to FIG. 10, the electronic system 1100 may include a controller 1110, an input/output device (I/O) 1120, a memory device 1130, an interface 1140 and a bus 1150.

The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not shown, the electronic system 1100 may further include high-speed DRAM and/or SRAM as the working memory for improving the operation of the controller 1110. Here, the semiconductor device manufactured using the mask error measurement system according to the example embodiment of the inventive concepts may be employed as the working memory, thereby improving product reliability.

Further, the semiconductor device manufactured using the mask error measurement system according to the example embodiment of the inventive concepts may be provided in the memory device 1130 or may be provided some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 11:
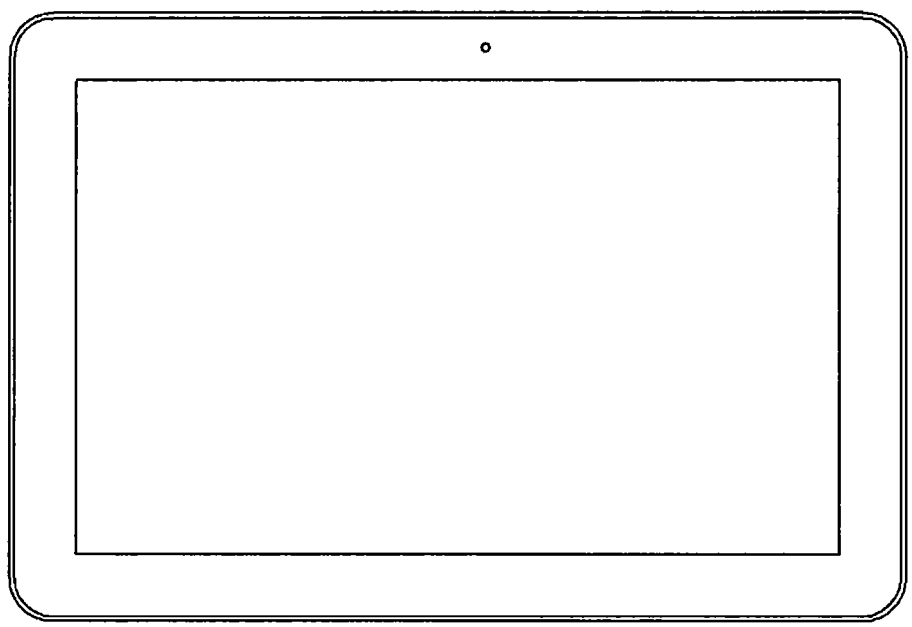
FIGS. 11, 12, and 13 illustrate example semiconductor systems to which one or more semiconductor devices manufactured using the mask error measurement systems according to some example embodiments of the inventive concepts are applied.
Figure 12:
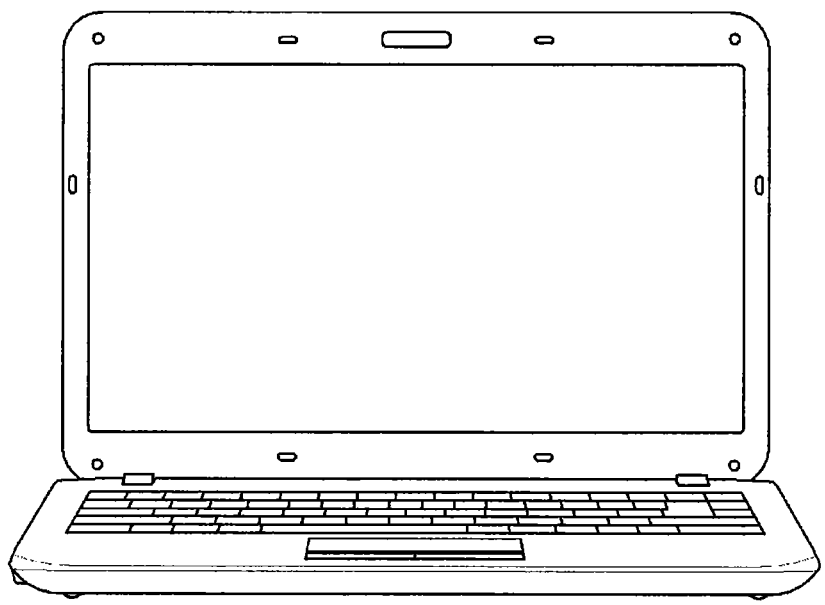
Figure 13:
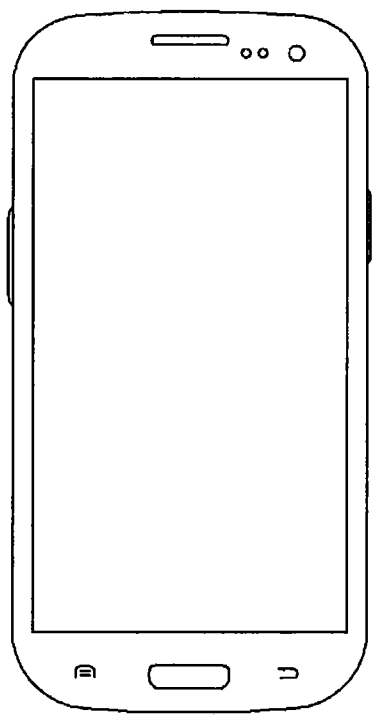

FIGS. 11, 12, and 13 illustrate example semiconductor systems to which one or more semiconductor devices manufactured using the mask error measurement systems according to some example embodiments of the inventive concepts can be applied.

FIG. 11 illustrates an example in which a semiconductor device according to an example embodiment of the inventive concepts is applied to a tablet PC (1200), FIG. 12 illustrates an example in which a semiconductor device according to an example embodiment of the inventive concepts is applied to a notebook computer (1300), and FIG. 13 illustrates an example in which a semiconductor device according to an example embodiment of the inventive concepts is applied to a smart phone (1400). At least one of the semiconductor devices according to some example embodiments of the inventive concepts can be employed to a tablet PC 1200, a notebook computer 1300, a smart phone 1400, and the like.

Further, the semiconductor devices manufactured using mask error measurement systems according to some example embodiments of the inventive concepts may also be applied to other IC devices not illustrated herein.

For example, in the above-described example embodiments, only the tablet PC 1200, the notebook computer 1300 and the smart phone 1400 have been exemplified as the semiconductor devices according to the example embodiments of the inventive concepts, but aspects of the inventive concepts are not limited thereto.

In some example embodiments of the inventive concepts, the semiconductor system may be implemented as a computer, an ultra mobile personal computer (UMPC), a work station, a net-book, a personal digital assistant (PDA), a portable computer, a wireless phone, a mobile phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or the like.

The example embodiments of the inventive concepts have been described with reference to the attached drawings, but it may be understood by one of ordinary skill in the art that the inventive concepts may be performed one of ordinary skill in the art in other specific forms without changing the technical concepts or essential features of the inventive concepts. Further, the above-described example embodiments are merely examples and do not limit the scope of the inventive concepts.

What is claimed is:

1. An apparatus for measuring a mask error, the apparatus comprising:
   a stage configured to accommodate,
      a reference mask having a reference pattern, and
      a target mask adjacent to the reference mask such that a mask pattern on the target mask faces the reference pattern;
   a light source configured to irradiate a first beam onto the reference mask and the target mask;
   a light receiving unit including an image sensor, and the image sensor configured to,
      receive a composite image including a first image generated from the reference pattern and a second image generated from the mask pattern, and
      generate a third image from the first image and the second image;
   a measuring unit configured to measure an error of the mask pattern from the third image; and
   a beam splitter configured to split the received images into the first image and the second image.

2. The apparatus of claim 1, wherein the stage accommodates the reference mask and the target mask such that,
   the reference mask is at a first distance away from a top surface of the image sensor, and
   the target mask is at a second distance, away from the top surface of the image sensor, the second distance being different from the first distance.

3. The apparatus of claim 2, wherein the light receiving unit further includes a compensating lens, the compensating lens configured to pass one of the first image and the second image therethrough and focus on the image sensor.

4. The apparatus of claim 1, wherein the beam splitter includes a polarizing beam splitter.

5. The apparatus of claim 1, wherein the light receiving unit further includes a shutter configured to receive the first image and the second image, the shutter further configured to shut the second image at a first time while supplying the image sensor with the first image, and shut the first image at a second time while supplying the image sensor with the second image, the second time being different from the first time.

6. The apparatus of claim 4, wherein the polarizing beam splitter is configured to polarize the first image to includes s-polarized beam and the second image to include p-polarized beam.

7. The apparatus of claim 1, wherein the light receiving unit further includes a lens, the lens including a first region having a first focal distance and configured to focus the first image and a second region having a second focal distance and configured to focus the second image, and the second focal distance being different from the first focal distance.

8. The apparatus of claim 7, wherein the lens comprises a first lens and a second lens spaced apart from the first lens, and the first lens is at the first region and the second lens is at the second region.

9. The apparatus of claim 8, further comprising:
   a shielding layer between the target mask and the lens, the shielding layer configured to optically separate the first image and the second image from each other.

10. The apparatus of claim 1, wherein the measuring unit is configured to measure a relative position of the mask pattern with respect to the reference pattern.

11. The apparatus of claim 1, wherein the image receiving unit is configured to receive the first image and the second image at different regions of the image sensor, respectively.

12. An apparatus for measuring a mask error, the apparatus comprising:
   a stage configured to accommodate,
      a reference mask including a reference pattern, and
      a target mask, which includes a mask pattern, on the reference mask such that the mask pattern faces the reference pattern in an aligned manner;
   a light source configured to irradiate a first beam onto the reference mask and the target mask;
   a beam splitter configured to receive the first beam and split the first beam into a second beam and a third beam, the second beam being a portion of the first beam reflected by the reference mask, the third beam being a portion of the first beam reflected by the target mask; and
   an image sensor configured to receive the second beam and the third beam.

13. The apparatus of claim 12, wherein the apparatus is configured to receive the second beam and the third beam at a same region of the image sensor.

14. The apparatus of claim 12, further comprising:
   a shutter configured to receive the first beam and the second beam,
   wherein the shutter is configured to supply the image sensor with a first image at a first time and supply the image sensor with a second image at a second time different from the first time.

15. An apparatus for measuring a mask error, the apparatus comprising:
   a stage configured to accommodate a reference mask having a reference pattern, and a target mask having a mask pattern;
   a light source irradiating a first beam onto the reference mask and the target mask;
   a light receiving unit including an image sensor, and the image sensor configured to,
      receive a second beam, which is generated by the first beam reflected by the reference pattern and the mask pattern, the second beam including a first image generated from the reference pattern and a second image generated from the mask pattern, and
      generate a third image from the first image and the second image;
   a processor configured to measure an error of the mask pattern from the third image based on a relative position of the mask pattern with respect to the reference pattern; and
   a beam splitter configured to split the second beam into the first image and the second image.

16. The apparatus of claim 15, wherein the stage is configured to accommodate the reference mask and the target mask having a mask pattern to be spaced apart vertically or horizontally.

17. The apparatus of claim 15, wherein the light receiving unit further includes:
   a compensating lens configured to pass, while compensate focus of, one of the first beam and the second beam.

18. The apparatus of claim 15, further comprising:
   a shutter configured to receive the first beam and the second beam, supply the image sensor with the first image at a first time, and supply the image sensor with the second image at a second time different from the first time.

19. The apparatus of claim 15, wherein the light receiving unit further includes one of:
   a lens including a first region and a second region, the first region having a first focal distance and configured to focus the first image, the second region having a second focal distance and configured to focus the second image, the second focal distance being different from the first focal distance, and
   a first lens and a second lens spaced apart from the first lens, and the first lens having the first focal distance, the second lens having the second focal distance.

* * * * *